`US007150516B2`

United States Patent
Dodd et al.

(10) Patent No.: US 7,150,516 B2
(45) Date of Patent: Dec. 19, 2006

(54) INTEGRATED CIRCUIT AND METHOD FOR MANUFACTURING

(75) Inventors: Simon Dodd, Philomath, OR (US); S. Jonathan Wang, Albany, OR (US); Dennis W. Tom, Corvallis, OR (US); Frank R. Bryant, Denton, TX (US); Terry E. McMahon, Albany, OR (US); Richard Todd Miller, Corvallis, OR (US); Gregory T. Hindman, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/977,091

(22) Filed: Oct. 29, 2004

(65) Prior Publication Data

US 2006/0071281 A1    Apr. 6, 2006

Related U.S. Application Data

(60) Provisional application No. 60/613,871, filed on Sep. 28, 2004.

(51) Int. Cl.
*B41J 2/05* (2006.01)
(52) U.S. Cl. .......................................... 347/59; 347/63
(58) Field of Classification Search ............ 347/57–59, 347/63, 203–206; 257/368
See application file for complete search history.

(56) References Cited

U.S. PATENT DOCUMENTS

| | | | |
|---|---|---|---|
| 4,719,477 A * | 1/1988 | Hess ............................ | 347/59 |
| 5,122,812 A * | 6/1992 | Hess et al. .................... | 347/59 |
| 5,635,968 A | 6/1997 | Bhaskar et al. | |
| 5,670,388 A | 9/1997 | Machesney et al. | |
| 5,870,121 A | 2/1999 | Chan et al. | |
| 6,274,482 B1 | 8/2001 | Wu et al. | |
| 6,286,939 B1 * | 9/2001 | Hindman et al. ............. | 347/63 |
| 6,372,639 B1 | 4/2002 | Stanton | |
| 6,498,381 B1 | 12/2002 | Halahan et al. | |
| 6,555,915 B1 | 4/2003 | Reber | |
| 6,559,047 B1 | 5/2003 | Doohan | |
| 6,561,626 B1 | 5/2003 | Min et al. | |
| 6,740,536 B1 * | 5/2004 | Dodd et al. ................... | 438/21 |
| 2002/0190328 A1 | 12/2002 | Bryant et al. | |
| 2003/0042606 A1 | 3/2003 | Derraa | |
| 2003/0136999 A1 | 7/2003 | Hodges et al. | |
| 2004/0012449 A1 | 1/2004 | Hung et al. | |

FOREIGN PATENT DOCUMENTS

EP        1415810        6/2004
WO    WO2004/001825    12/2003

* cited by examiner

*Primary Examiner*—An H. Do

(57) ABSTRACT

A fluid ejection device including: a substrate having a first surface having an non-doped region; a first insulative material disposed on a portion of the first surface, the first insulative material having a plurality of openings forming a path to the first surface; a first conductive material disposed on the first insulative material, the first conductive material being disposed so that the plurality of openings are substantially free of the first conductive material; a second insulative material disposed on the first conductive material and portions of the first insulative material, the second insulative material being disposed so that the plurality of openings are substantial free of the second insulative material and a second conductive material being disposed on second insulative material and within plurality of openings so that some of the second conductive material disposed upon the second insulative material is in electrical contact with the non-doped region on the substrate.

21 Claims, 8 Drawing Sheets

INTEGRATED CIRCUIT AND METHOD FOR MANUFACTURING

CROSS-REFERENCE TO RELATED APPLICATIONS

This application claims the benefit of U.S. Provisional Application No. 60/613,871, filed on Sep. 28, 2004.

BACKGROUND

The market for electronic devices continually demands increased performance at decreased costs. In order to meet these requirements the components which comprise various electronic devices are desired to be made more efficiently and to more demanding design specifications.

One type of electronic device is a metal oxide silicon transistor device. These oxide silicon transistor devices are formed in large numbers on a single substrate, such as a silicon substrate. A problem in operating such devices at high voltages is that continuous operation may cause formation of a number of electron-hole pairs at junctions of the transistor, e.g. drain-gate junction. The electron-hole pairs, if they form sufficiently large charge concentrations, may decrease threshold voltage of the transistors or may lead to a turning of parasitic lateral bipolar transistor formed in the substrate.

Two countervailing factors in the design and manufacture of electronic devices are improved performance and decreased cost. Often these two factors are in direct opposition, since the formation of more precise geometries and additional structures require additional processing and masks that add to the cost of devices. On the other hand, reducing processing and masks may lead to performance problems or the inability to provide operation within performance specifications, since structures may have to be omitted from the electronic device.

BRIEF DESCRIPTION OF THE DRAWINGS

Features of the invention will readily be appreciated by persons skilled in the art from the following detailed description of exemplary embodiments thereof, as illustrated in the accompanying drawings, in which.

DETAILED DESCRIPTION OF THE DRAWINGS

Figure 1:
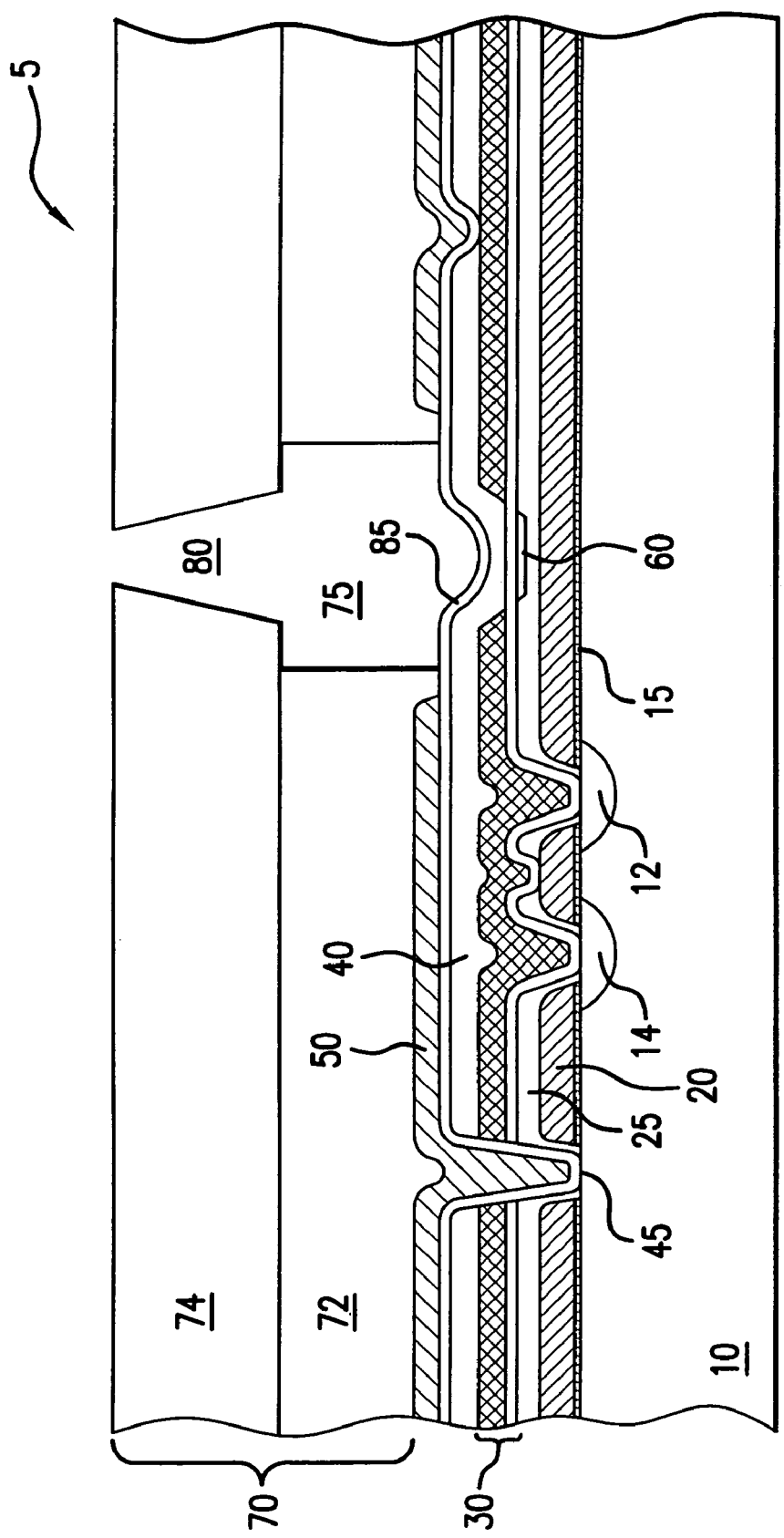
FIG. 1 illustrates a cross-sectional view of a fluid ejection device according to one embodiment.

Referring to FIG. 1, a cross-sectional view of a fluid ejection device according to one embodiment is illustrated. A semiconductor device 5 is formed on and/or in substrate 10, which is preferably silicon though other substrates known to those skilled in the art may be used. Substrate 10 is processed using conventional semiconductor processing techniques to form one or more areas 12 and 14 having different impurity concentrations, e.g. active regions that form a transistor or diode. In this embodiment, where semiconductor device 5 includes Metal Oxide Semiconductor Field Effect Transistors (MOSFETs) active areas may include drain and source regions formed in substrate 10.

A gate oxide layer 15 is disposed over a surface of the substrate 10. A semiconductor layer 20, e.g. formed of polysilicon, is disposed over the gate oxide layer 15. In some areas, a passivation layer 25, e.g. phosphosilicate glass, is disposed over semiconductor layer 20. In other areas, a conductive layer 30 disposed over semiconductor layer 20. However, other structures with only a conductive layer may be utilized.

In the embodiment depicted in FIG. 1, conductive layer 30 comprises a resistive material, e.g. a tantalum-aluminum material, which has a conductive material, e.g. aluminum, disposed thereon. It should also be noted that conductive layer 30 is disposed over passivation layer 25 as well. Further, the materials used to form resistive material and/or conductive material may vary and depend upon the application and specifications.

A passivation layer 40 is disposed over conductive layer 30 in order to insulate and protect conductive layer 30. The passivation layer 40 may be formed of one or more silicon carbide and silicon nitride, or multiple layers of each of these or combinations thereof. Further, other materials or combinations thereof may be utilized for passivation layer 40.

A plurality of openings 45 are formed in gate oxide layer 15, semiconductor layer 20, passivation layer 25, conductive layer 30, and passivation layer 40 to allow conductive layer 50, which is also disposed over passivation layer 40 to contact the surface, or if the surface is partially removed, other portions of substrate 10. In one embodiment, conductive layer 50 contacts body regions of a transistor device that are formed in substrate 10. In these embodiments, the body region may be a p-doped region, however, other dopings may be utilized.

In one embodiment, the openings 45 and the resulting contacts formed therein are formed as close to active regions or devices formed in the substrate as possible, without affecting the operation of the devices or active regions. The exact positioning, may be dependent on the substrate type and doping concentration of the active regions. In addition, the number of contacts is dependent on the number of active regions or devices formed in the substrate. In one embodiment, there may be one contact for every device formed in the substrate. In certain embodiments, the number of contacts may be a function of the power of the devices formed in the substrate, the doping concentration of active regions, and the substrate material.

The creation of a direct contact to the body of a MOSFET can be used to prevent an increase of hole pairs at a drain/gate interface, which in turn can reduce the likelihood that the MOSFET is switched on due to small leakage currents provided at its gate.

In certain embodiments, direct contact may be made between one or more transistors formed in substrate 10. In these embodiments, contact may be made adjacent a source region of one or more of the transistors. In these embodiments contacts to the source region and the body may be made at the same or different times. In an embodiment where semiconductor device 5 is a fluid ejection device, the direct contact may be between a logic transistor and a drive transistor that operate ejection elements.

The resistor 60 and the passivation layer 40 are protected from damage, due to for example bubble collapse, in fluid chamber 75 after fluid ejection from orifice 80 by a cavitation layer 85 that is disposed over passivation layer 40. In certain embodiments, cavitation layer 85 comprises a metal selected from the group consisting of tantalum, tungsten, and molybdenum.

An orifice layer 70, shown as a barrier layer 72 and a nozzle layer 74 are provided to create a chamber 75 and orifice 80 through which fluid may be ejected. Generally, the other layers that are disposed on substrate 10 before applying the orifice layer 70. The orifice layer 70 can be a single or multiple layer(s) of polymers, epoxy materials, metals, or the like. Several methods, materials, and structures for creating the orifice layer 70 are known and may be utilized with the structure of FIG. 1.

Figure 2:
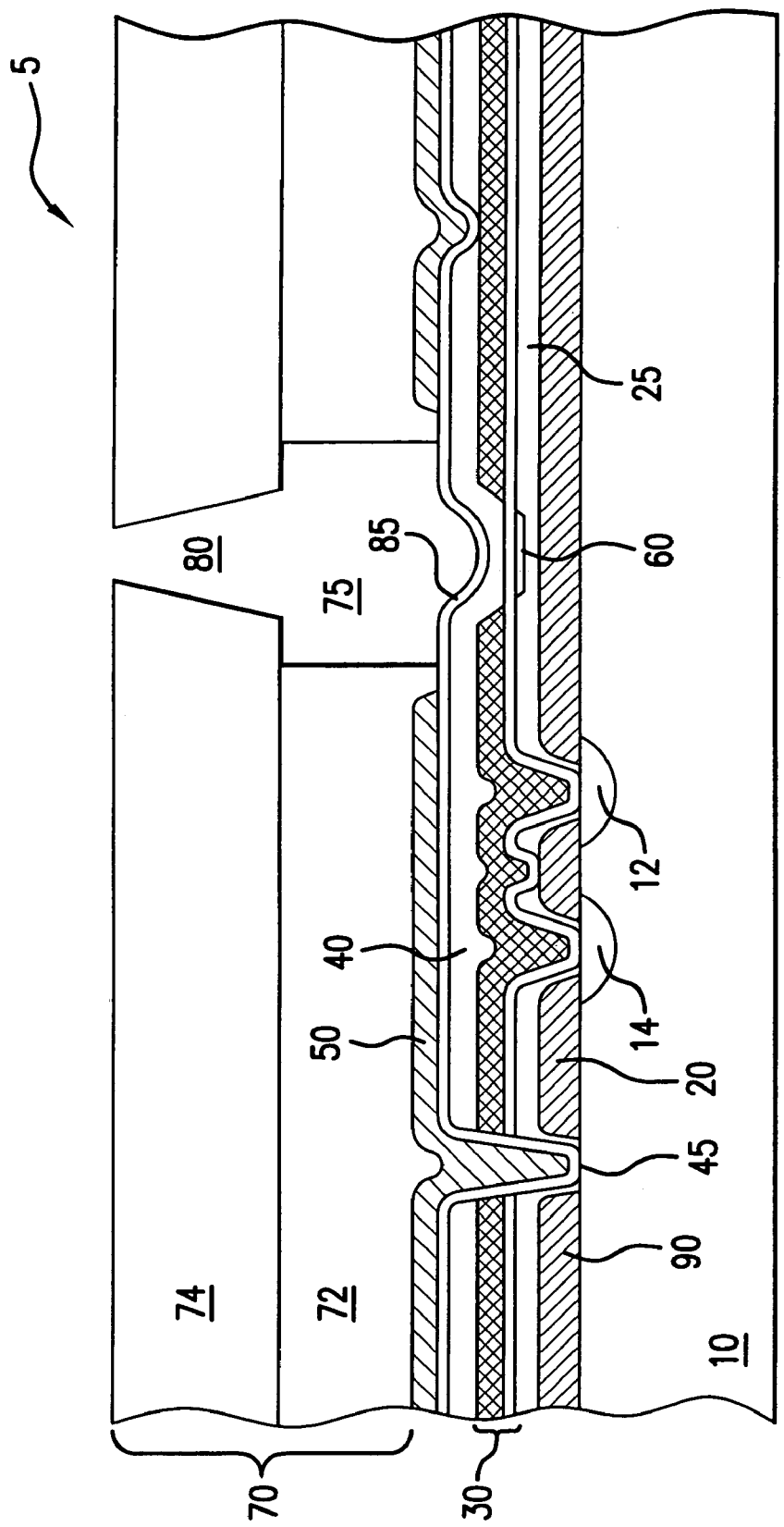
FIG. 2 illustrates a cross-sectional view of a fluid ejection device according to another embodiment.

Referring to FIG. 2, a cross-sectional view of a fluid ejection device according to another embodiment is illustrated. The fluid ejection device of FIG. 2 is substantially similar to FIG. 1. However, a field oxide 90 is disposed on some portions of the surface of substrate 10. The field oxide 90 is provided adjacent to contact regions 95 through which conductive layer 50 is to contact substrate 10. Field oxide 90 generally provides a greater barrier to diffusion than does gate oxide 15.

While FIGS. 1 and 2 provide descriptions of embodiments of fluid ejection devices, however, other semiconductors devices and structures may be utilized having similar layouts and designs. For example, such structures would have orifice layer 70 and cavitation layer 85, and a passivation structure that is different in structure and/or material from passivation layer 40.

Figure 3:
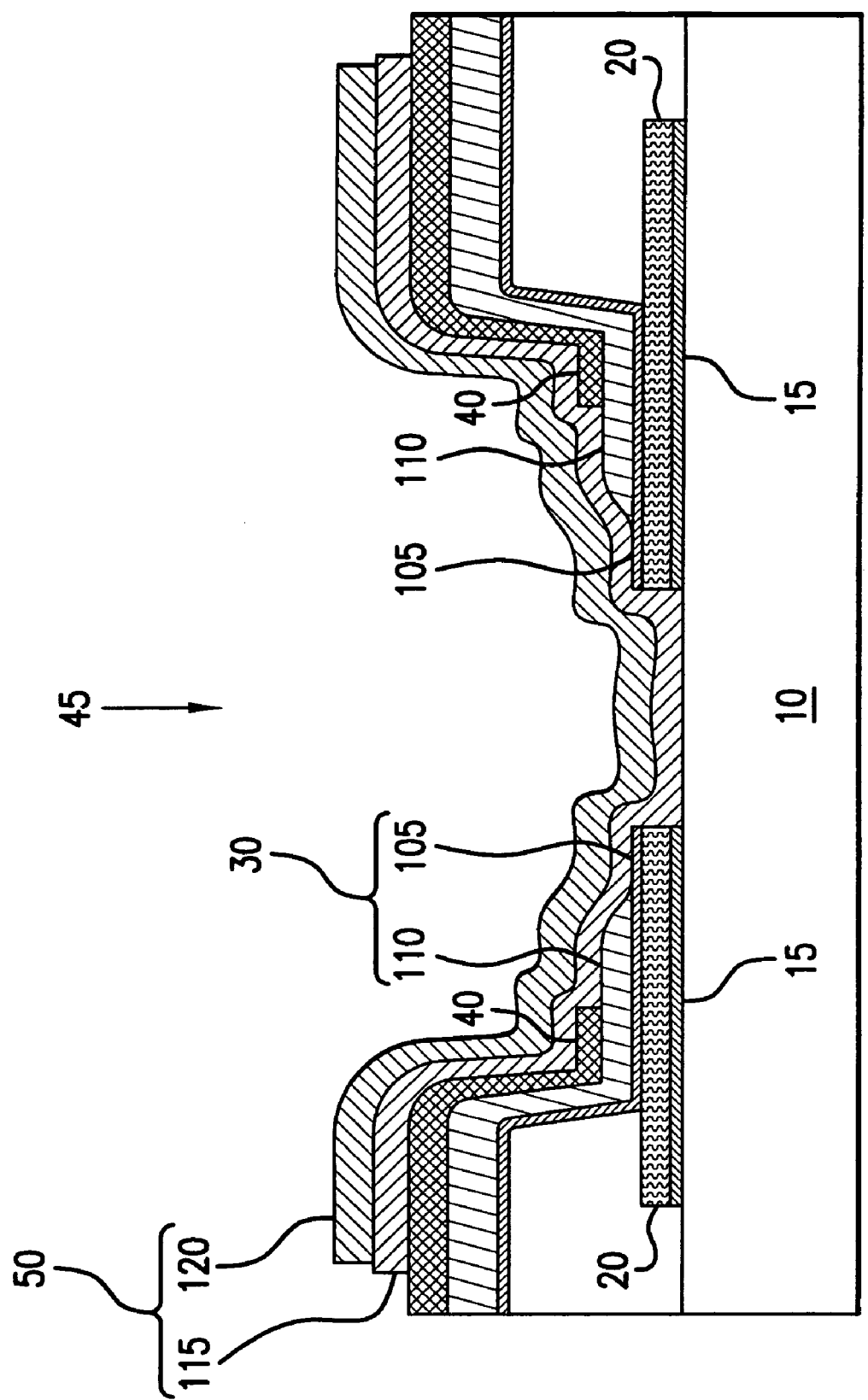
FIG. 3 illustrates an exploded cross-sectional view of a portion of the fluid ejection device of FIG. 1 according to one embodiment.

Referring to FIG. 3, an exploded cross-sectional view of a portion of the fluid ejection device of FIG. 1 according to one embodiment is illustrated. Opening 45 extend from a top surface of passivation layer 40 to a surface of substrate 10. Conductive layer 50, which comprises a resistive layer 115 and a conductive layer 120 disposed over resistive layer 115 is contact with the surface of substrate 10. It can be seen that some portions of conductive layer 50 that overlie passivation layer 25, conductive layer 30, and passivation layer 40 are in electrical contact with those portions of conductive layer 50 that are in physical contact with a surface of substrate 10. As such a robust substrate contact may be created that provides benefits with respect to parasitic turn of devices formed in substrate 10.

An additional design feature of the embodiment depicted in FIG. 3 is that resistive layer 105, conductive layer 110, and passivation layer 40 form a stair-step pattern when viewed from a cross-sectional perspective. This allows for simpler manufacturer. Other embodiments, may utilize different layouts.

Figure 4:
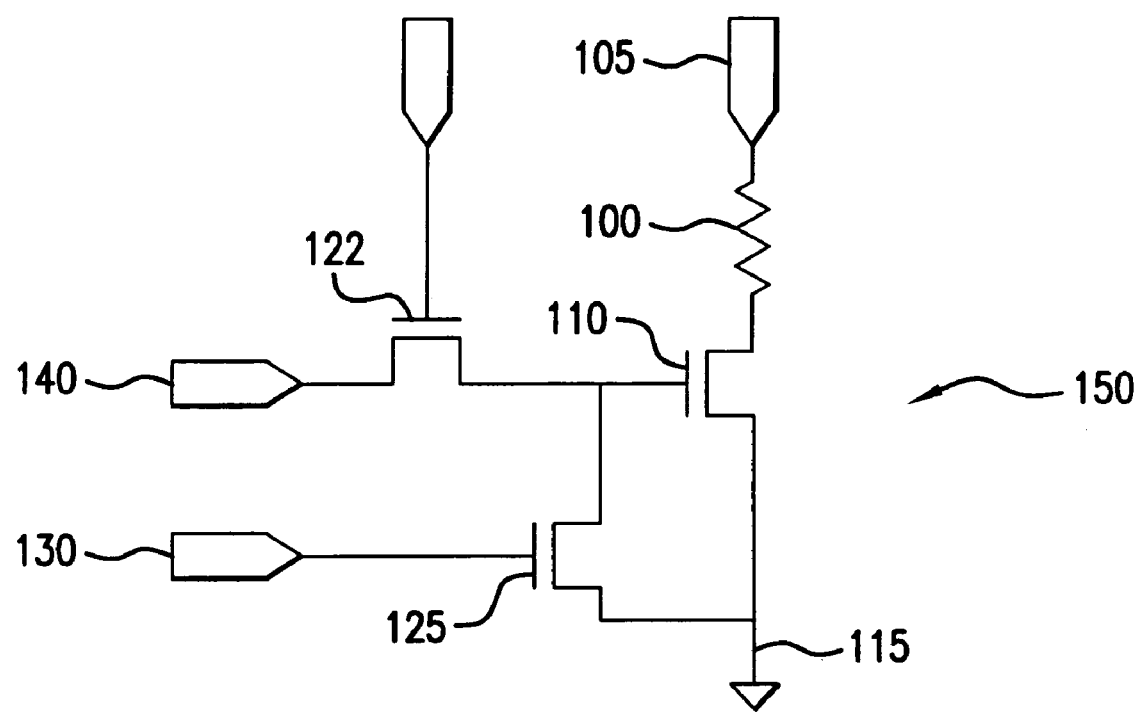
FIG. 4 illustrates a schematic of a circuit used to selectively control fluid ejection according to one embodiment.

Referring to FIG. 4, a schematic of a circuit 150 used to selectively control fluid ejection according to one embodiment is illustrated. The ejection element 100 is coupled to receive power 105 and to the drain of transistor 110. The source of transistor 110 is connected to ground 115. The gate of transistor 110 is connected to the source of transistor 122 and the drain of transistor 125. The source of transistor 125 is connected to ground 115. The gate of transistor 125 is coupled to receive a first control signal 130. The gate of transistor 122 is coupled to receive a second control signal 135, while its gate is coupled to receive an address signal 140.

In certain embodiments, contacts to body regions may be formed between a source region of transistor 110 and the source region of any of transistors 122 or 125. In some embodiments, where each ejection element is operated using the circuit 150 depicted in FIG. 4, a body contact can be made in each circuit 150 or some of the circuits 150.

Figure 5:
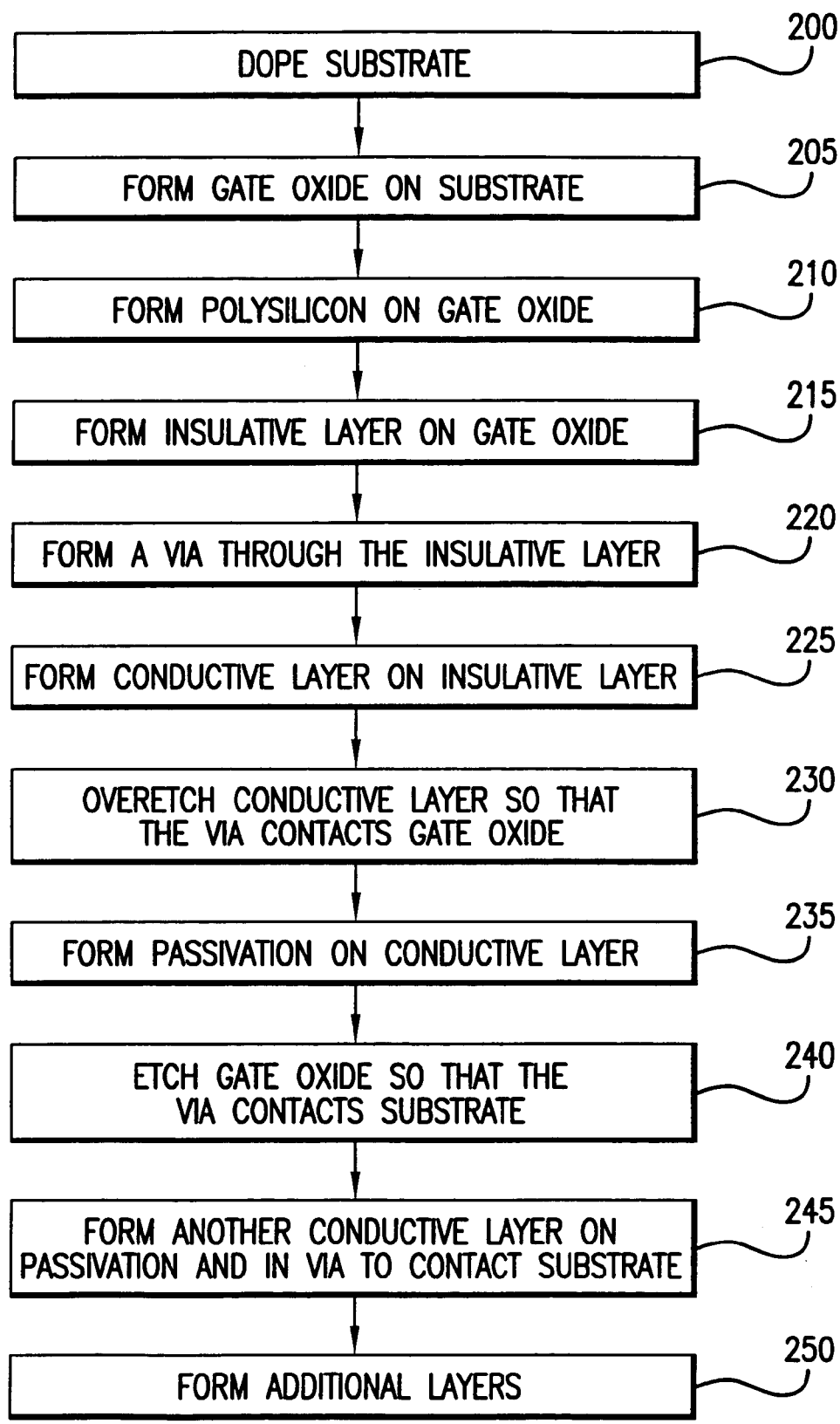
FIG. 5 illustrates a flow chart of a process for forming a fluid ejection device according to one embodiment.

Referring to FIG. 5, a flow chart of a process for forming a fluid ejection device according to one embodiment is illustrated. A substrate, e.g. substrate 10, may be doped with a p-dopant for an NMOS process, block 100. However, the substrate may also be doped with an n-dopant for a PMOS process. A gate oxide material is then provided over a surface of the substrate, block 205. After the gate oxide material is provided, a semiconductor material, such as polysilicon, is provided over the gate oxide material, block 210. An insulative material, such as phosphosilicate glass, is provided over semiconductor material, block 215.

After providing the insulative material, one or more vias are formed in the insulative material, block 220. For example, the one or more vias may be formed in areas where a contact to a body of a transistor may be desired to be formed. The vias may be etched to a surface of the semiconductor material provided in block 215. After formation of the one or more vias, a first conductive layer is provided over the insulative material and into the one or more vias, block 220. The one or more vias are then overetched such that not only the conductive material in the one or more vias, but also the semiconductor material that underlie the one or more vias are removed, block 230. In this embodiment, the gate oxide formed still remains in the vias. In one embodiment, the overetching process is a reactive ion etching process.

After the conductive material and semiconductor material are removed, a passivation material is provided onto the conductive material, block 235. In some embodiments the passivation material is not provided into the one or more vias. In other embodiments, the passivation material is applied into the vias and then removed. The gate oxide remaining in the vias is then etched away so that the vias are open to the substrate, block 240. A second conductive material is then provided that contacts the substrate in the vias, block 245. Additional layers that are required to form a semiconductor device are then provided, block 250.

Figure 6:
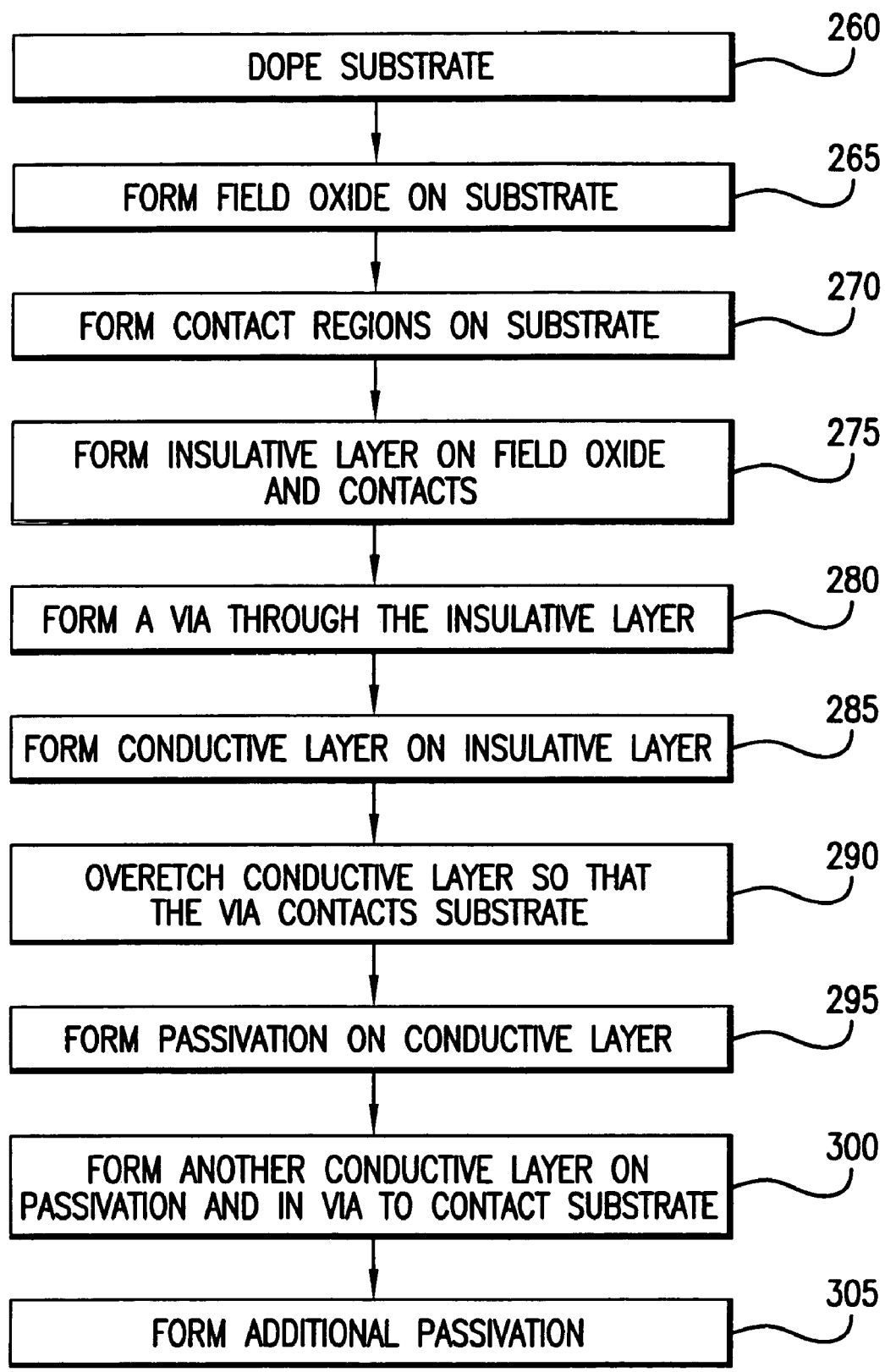
FIG. 6 illustrates a flow chart of a process for forming a fluid ejection device according to another embodiment.

Referring to FIG. 6 a flow chart of a process for forming a fluid ejection device according to another embodiment is illustrated. A substrate, e.g. substrate 10, may be doped with a p-dopant for an NMOS process, block 260. However, the substrate may also be doped with an n-dopant for a PMOS process, as described with respect to FIG. 5.

One or more contact regions are formed on the substrate, block 265. The one or more contact regions may be formed by, for example, disposing a semiconductor material upon a gate oxide which is disposed upon a surface of the substrate. A field oxide is then provided adjacent the contacts, block 270. Alternatively, field oxide may be provided, such that openings remain where contacts may be formed.

An insulative material, such as phosphosilicate glass, is provided over the contacts and field oxide, block 275. One or more vias are then formed through the insulative material, block 280. The vias are formed to overlie one or more of the contact areas. In such a way, the vias may correspond to regions where contact is to be made to the substrate or to areas where transistor gate contacts are to be formed.

After formation of the vias, a conductive material is provided overlying the insulative material and in the vias, block 285. The conductive material in the vias, and other regions as desired, is etched away, block 290. In one embodiment, the etching of the conductive material in the vias also etches, at least a portion of the contacts. The etching of at least a portion of the contacts may be accomplished, for example, by overetching utilizing a reactive ion etching process. In some embodiments, a secondary etching process may utilized after the first etching process, in order to remove any remaining contact material.

After the etching the conductive material, a second insulative material is provided onto the first conductive material, block 295. In one embodiment, the second insulative material is provided such that it does not fill or enter into the vias. In other embodiments, the second insulative material may be provided into the vias along with being provided onto the first conductive material. The second insulative material that is provided into the vias can then be removed utilizing know processes.

After the second insulative material is provided, a second conductive material is provided overlying second insulative material and into the vias, block 300. The second conductive material is provided into vias, such that portions of the second conductive material provided into the vias is in contact with the substrate, and an electrical contact to portions of the second conductive material overlying the second insulative material is provided. Additional passivation material may then be provided over the second conductive material and other portions of the device, block 305.

The embodiment depicted in FIG. 5, may be altered by omitting block 255 and only utilizing a field oxide. In this embodiment block 260 would entail providing field oxide over the entire area of a substrate where structures are to be formed. Further, block 280 may entail overetching the first conductive material so that the field oxide underlying the vias is etched away to allow contact to the substrate. Alternatively, a separate process block to remove the oxide prior to providing the first conductive material may be utilized and a standard etching process utilized at block 180.

Figure 7:
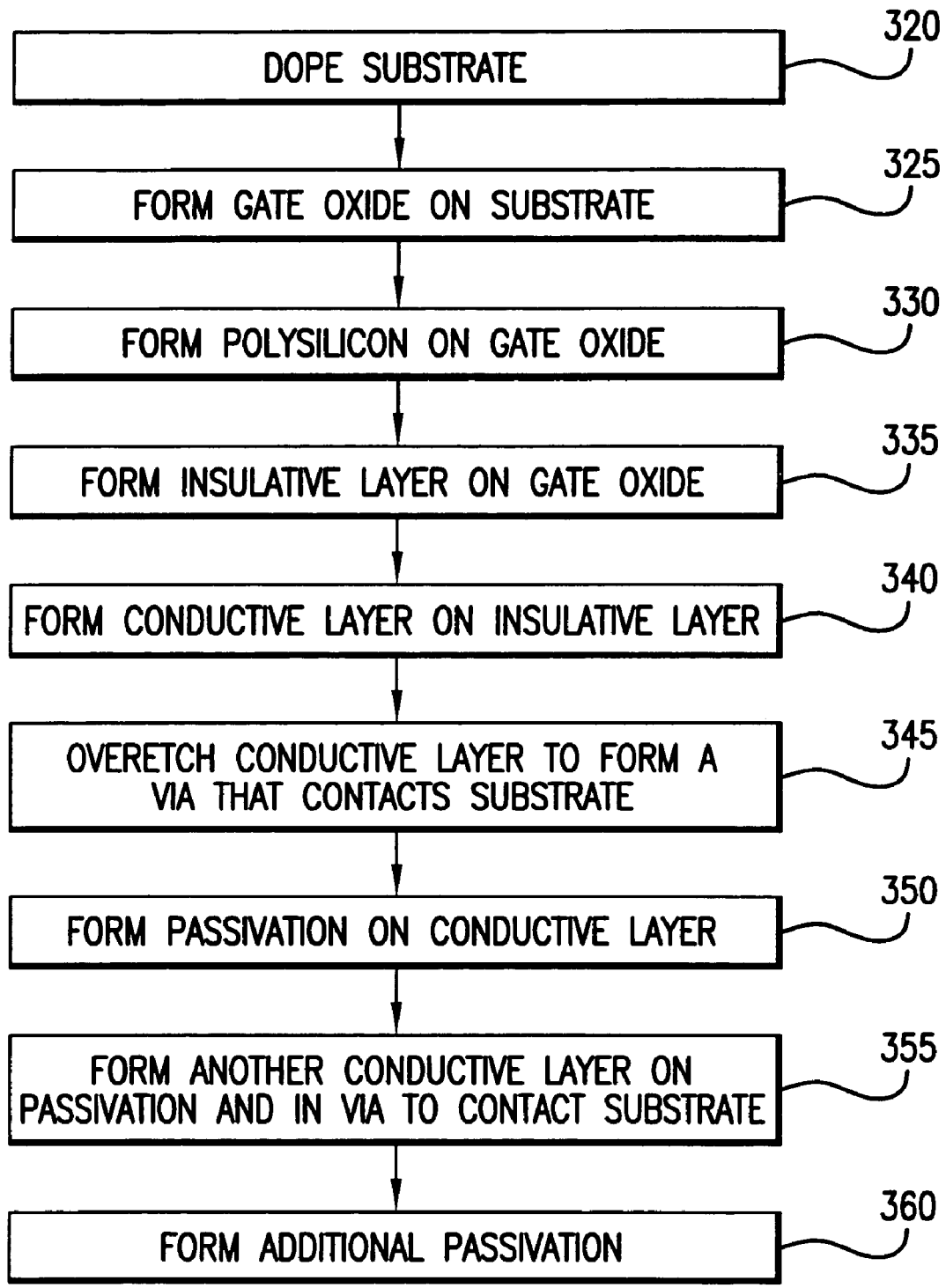
FIG. 7 illustrates a flow chart of a process for forming a fluid ejection device according to another embodiment.

Referring to FIG. 7, a flow chart of a process for forming a fluid ejection device according to another embodiment is illustrated. In the embodiment of FIG. 7, blocks 320–340 are substantially the same as blocks 200–215 and 225 of as described with respect to FIG. 5. However, instead of forming a via in the first insulative material prior to providing the first conductive layer, as in FIG. 5, vias are formed by etching through the first conductive layer and the first insulative layer in one process block, i.e. block 345. After formation of these vias, blocks 330-340 are substantially the same as blocks 235–245 as described with respect to FIG. 5.

As can be seen from FIGS. 4–6 the number of processing blocks need not be increased, in fact the number of blocks is substantially the same. Further, since an overetching process may be utilized, in some embodiments, the actual processes used to form a structure with a body contact are the same as those without. Further, since additional processing is not utilized to form the opening, i.e. other then etching the conductive layer, there is less likelihood that misalignment or diffusion into the substrate would occur then would result if additional processing was used to form the contact to the substrate.

In some embodiments of the methods described with respect to FIGS. 4 and 6, overetching can be such that portions of the substrate are removed along with the conductive, semiconductor, and gate oxide layers. This approach may be utilized, for example, where a contact is being made to a body of a substrate through a region of the device which has been doped as a source region of a transistor. The second conductive layer can then be provided such that it contacts the body region of the substrate, where the substrate has been etched away.

Figure 8:
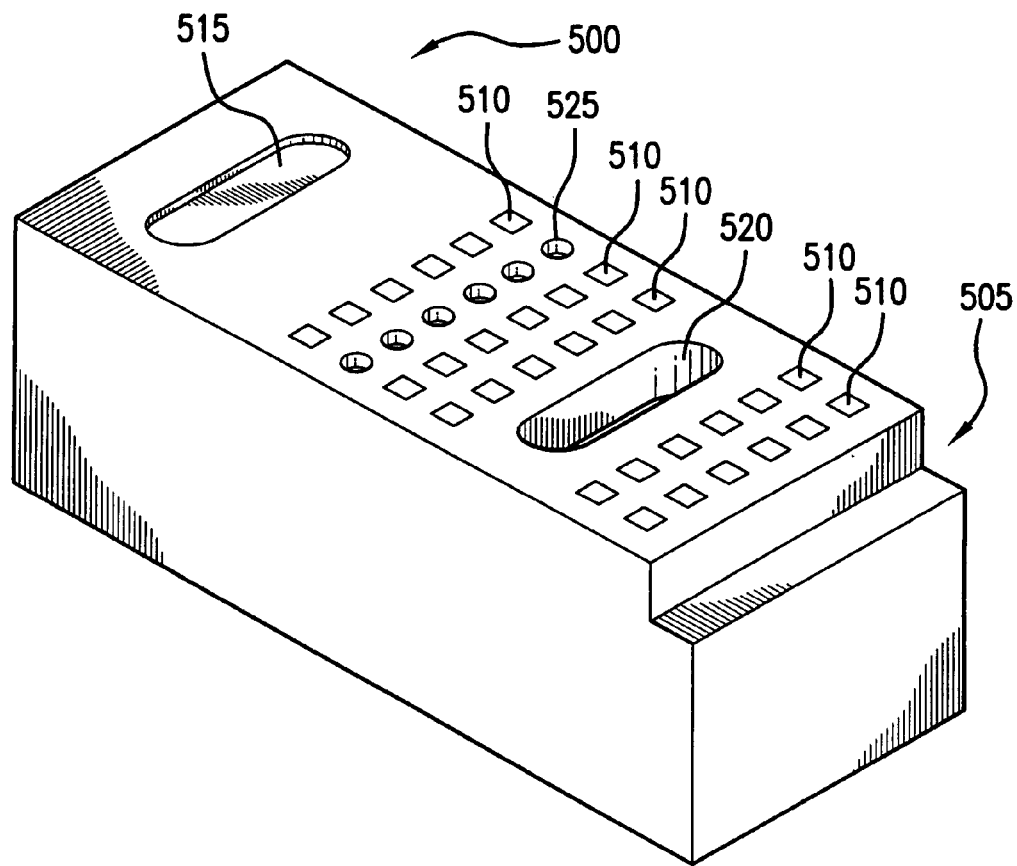
FIG. 8 illustrates a top-view of a fluid ejection device according to one embodiment.

FIG. 8 illustrates an enlarged view of one embodiment of the printhead 400 in perspective view. The printhead 500 in this embodiment has multiple features, including an edge step 505 for an edge fluid feed to resistors (or fluid ejectors) 510. The printhead may also have a trench 515 that is partially formed into the substrate surface. A slot (or channel) 520 to feed fluid to resistors 510, and/or a series of holes 525 feeding fluid to resistors 510 are also shown on this printhead. In one embodiment there may be at least two of the features described on the printhead 500 in FIG. 1. For example, only the feed holes 525 and the slot 520 are formed in the printhead 500, while the edge step 505 and/or the trench 515 are absent. In another embodiment, the edge step 505, and the slot 520 are formed in the printhead 520, while trench 515 and/or the feedholes 525 are absent. Different combinations of these features, with other features, or wholly different features may also be provided.

Figure 9:
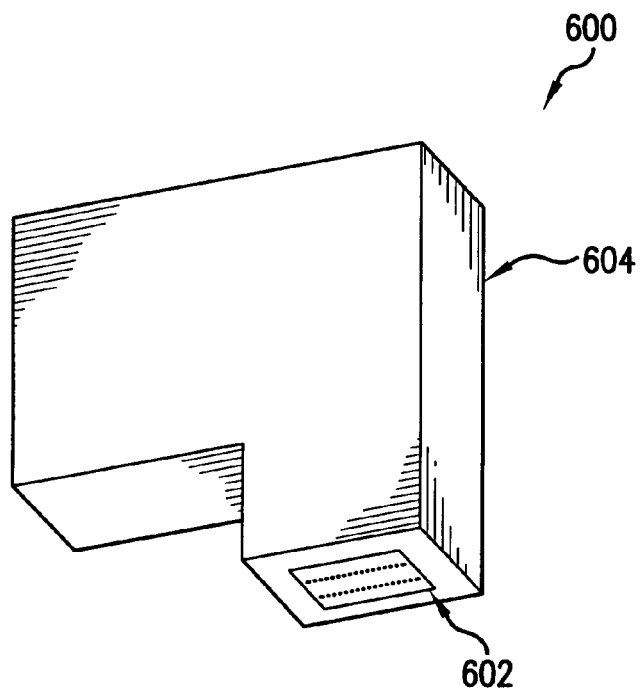
FIG. 9 illustrates a fluid ejection assembly according to one embodiment.

FIG. 9 shows a diagrammatic representation of an exemplary print cartridge 600 that can be utilized in an exemplary printing device. The print cartridge is comprised of a printhead 602 and a cartridge body 604 that supports the printhead. Though a single printhead 602 is employed on this print cartridge 600 other embodiments may employ multiple printheads on a single cartridge.

Print cartridge 600 is configured to have a self-contained fluid or ink supply within cartridge body 604. Other print cartridge configurations alternatively or additionally may be configured to receive fluid from an external supply. Other exemplary configurations will be recognized by those of skill in the art.

The semiconductor device structures described herein are applicable to a broad range of semiconductor devices technologies and can be fabricated from a variety of semiconductor materials. Therefore, while the above description describes several embodiments of semiconductor devices implemented in silicon substrates, the methods and structures described herein and depicted in the drawings may also be employed in gallium arsenide, germanium, and other semiconductor materials. Accordingly, the methods and structures described herein and depicted in the drawings is not intended to be limited to those devices fabricated in silicon semiconductor materials, but will include those devices fabricated in one or more of the available semiconductor materials and technologies available to those skilled in the art.

Further, while the illustrated embodiments have been shown to include specific p and n type regions, it should be clearly understood that the teachings herein are equally applicable to semiconductor devices in which the conductivities of the various regions have been reversed, for example, to provide the dual of the illustrated device.

In addition, although the embodiments illustrated herein are shown in two-dimensional views with various regions having depth and width, it should be clearly understood that these regions are illustrations of only a portion of a single cell of a device, which may include a plurality of such cells arranged in a three-dimensional structure. Accordingly, these regions will have three dimensions, including length, width, and depth, when fabricated on an actual device.

It should be noted that the drawings are not true to scale. Moreover, in the drawings, heavily doped regions (typically concentrations of impurities of at least $1 \times 10^{19}$ impurities/ cm.sup.$^3$) are designated by a plus sign (e.g., n$^+$ or p$^+$) and lightly doped regions (typically concentrations of no more than about 5×10$^{16}$ impurities/cm$^3$) by a minus sign (e.g. p$^-$ or n$^-$).

Active area component, e.g. the source and drain, isolation of a MOSFET (metal oxide semiconductor field effect transistor) is conventionally accomplished by using two mask layers, an island layer and a gate layer. The island layer is used to form an opening within thick field oxide grouse on a substrate. The gate layer is used to create the gate of the transistor and forms the self-aligned and separate active areas (the source and drain) of the transistor within the island opening of the thick field oxide.

Although the inventive concepts have been described in language specific to structural features and methodological steps, it is to be understood that the appended claims are not limited to the specific features or steps described. Rather, the specific features and steps are disclosed as preferred forms of implementing the inventive concepts.

What is claimed is:

1. A fluid ejection device comprising:
   a substrate comprising a first surface having at least one non-doped region;
   a first insulative material disposed on at least a portion of the first surface, the first insulative material comprising a plurality of openings formed to the first surface;
   a first conductive material disposed on the first insulative material, the first conductive material being disposed so that the plurality of openings are substantially free of the first conductive material;
   a second insulative material disposed on the first conductive material and portions of the first insulative material, the second insulative material being disposed so that the plurality of openings are substantially free of the second insulative material;
   a second conductive material being disposed on second insulative material and within plurality of openings so that some of the second conductive material disposed upon the second insulative material is in electrical contact with the at least one non-doped region on the substrate;
   a plurality of chambers formed in a material on the surface of the substrate; and
   a plurality of openings formed to allow passage of a fluid from the chambers out through the plurality of openings.

2. The fluid ejection device of claim 1 wherein the first insulative material comprises a gate oxide and the structure further comprising a polysilicon material disposed upon the gate oxide material, the polysilicon material being disposed so that that the plurality of openings are substantially free of the polysilicon material.

3. The fluid ejection device of claim 1 wherein the first insulative material comprises a field oxide and portions of the first insulative where each opening of the plurality of openings are formed comprise a gate oxide.

4. The fluid ejection device of claim 1 wherein the second conductive material comprises tantalum.

5. The fluid ejection device of claim 1 wherein the second conductive material comprises a resistive portion and a conductive portion disposed upon the resistive portion.

6. The fluid ejection device of claim 1 further comprising a plurality of doped regions formed within the substrate and wherein each of the plurality of openings are formed adjacent to the plurality of doped regions.

7. The fluid ejection device of claim 1 further comprising a fluid handling slot that is fluidically coupled to the plurality of chambers.

8. The fluid ejection device of claim 1 wherein the second insulative material comprises phosphosilicate glass.

9. The fluid ejection device of claim 1 wherein the first conductive material comprises a resistive portion and a conductive portion disposed upon the resistive portion.

10. The fluid ejection device of claim 1 wherein the plurality of openings form a path to a region below the first surface of the substrate.

11. A fluid ejection device, comprising:
    a substrate comprising at least one non-doped region;
    a first insulative material overlying at least a portion of the first surface, the first insulative material disposed to include a plurality of openings between portions that allow contact with the substrate;
    a first conductive material overlying at least a portion of the first insulative material, the first conductive material being positioned so that the plurality of openings are substantially free of the first conductive material;
    a second insulative material overlying at least a portion of the first conductive material and portions of the first insulative material, the second insulative material positioned so that the plurality of openings are substantially free of the second insulative material;
    a second conductive material overlying at least a portion of the second insulative material and disposed within the plurality of openings so that some of the second conductive material disposed upon the second insulative material is in electrical contact with the at least one non-doped region on the substrate; and
    a plurality of resistor elements configured to heat fluid in response to a current, the plurality of resistors being coupled to the first conductive material so that the current is conducted by the first conductive material.

12. The semiconductor structure of claim 11 further comprising a gate oxide and a polysilicon material underlying the first insulative material, the plurality of openings are substantially free of the polysilicon material and the gate oxide.

13. The semiconductor structure of claim 11 further comprising a field oxide underlying the first insulative materials and wherein the plurality of openings are free of the field oxide.

14. The semiconductor structure of claim 11 wherein the second conductive material comprises tantalum.

15. The semiconductor structure of claim 11 wherein the second conductive material comprises a resistive portion and a conductive portion disposed upon the resistive portion.

16. The semiconductor structure of claim 11 further comprising a plurality of doped regions formed within the substrate and wherein each of the plurality of openings are formed adjacent to one of the plurality of doped regions.

17. The semiconductor structure of claim 16 wherein the plurality of doped regions form transistors.

18. The semiconductor structure of claim 11 further comprising a plurality of fluid chambers each disposed above one resistor of the plurality of resistors and an orifice positioned to allow ejection of fluid from the fluid chamber via the orifice.

19. The semiconductor structure of claim 11 wherein the second insulative material comprises phosphosilicate glass.

20. The semiconductor structure of claim 11 wherein the first conductive material comprises a resistive portion and a conductive portion overlying the resistive portion.

21. The semiconductor structure of claim 11 wherein the plurality of openings form a path to a region below a surface of the substrate.

* * * * *

UNITED STATES PATENT AND TRADEMARK OFFICE
CERTIFICATE OF CORRECTION

PATENT NO.         : 7,150,516 B2
APPLICATION NO. : 10/977091
DATED                : December 19, 2006
INVENTOR(S)       : Simon Dodd et al.

Page 1 of 1

It is certified that error appears in the above-identified patent and that said Letters Patent is hereby corrected as shown below:

On the Title page, in Item (57), under "Abstract" in column 2, line 12, delete "substantial" and insert -- substantially --, therefor.

On the Title page, in Item (57), under "Abstract" in column 2, line 12, after "material" insert -- ; --.

In column 6, line 52, delete "indude" and insert -- include --, therefor.

In column 7, line 50, in Claim 2, after "that" delete "that".

Signed and Sealed this

Fourteenth Day of April, 2009

JOHN DOLL
*Acting Director of the United States Patent and Trademark Office*